United States Patent [19]
Chang

[11] Patent Number: 6,147,516
[45] Date of Patent: Nov. 14, 2000

[54] POWER EDGE DETECTOR

[75] Inventor: Peter Chang, Taipei, Taiwan

[73] Assignee: Micon Design Technology Co., Ltd., Taipei, Taiwan

[21] Appl. No.: 09/166,993

[22] Filed: Oct. 6, 1998

[30] Foreign Application Priority Data

Jul. 14, 1998 [TW] Taiwan .................................. 87211356

[51] Int. Cl.[7] .................................................. H03K 5/153
[52] U.S. Cl. ............................. 327/62; 327/143; 327/198
[58] Field of Search ................................. 327/50, 58, 62, 327/141, 142, 143, 198, 379, 383, 389, 391, 427, 437, 77, 78

[56] References Cited

U.S. PATENT DOCUMENTS

| | | | |
|---|---|---|---|
| 5,321,317 | 6/1994 | Pascucci et al. ........................ | 327/143 |
| 5,513,358 | 4/1996 | Lundberg et al. ....................... | 713/330 |
| 5,565,807 | 10/1996 | Ward ....................................... | 327/205 |
| 5,680,069 | 10/1997 | Okumura ................................ | 327/333 |
| 5,767,710 | 6/1998 | Cho ......................................... | 327/143 |

Primary Examiner—Timothy P. Callahan
Assistant Examiner—Minh Nguyen
Attorney, Agent, or Firm—Harness, Dickey & Pierce, P.L.C.

[57] ABSTRACT

A power edge detector includes a voltage divider, a pull-up circuit, and a cut-in pull-down circuit. The voltage divider receives and divides an input power voltage so as to generate a divided voltage. The pull-up circuit receives the input power voltage and transmits the input power voltage to an output terminal when the input power voltage does not exceed a predetermined threshold. The cut-in pull-down circuit is connected to the voltage divider and the pull-up circuit for pulling down the voltage level of the output terminal in response to the divided voltage when the input power voltage exceeds the predetermined threshold.

17 Claims, 2 Drawing Sheets

POWER EDGE DETECTOR

BACKGROUND OF THE INVENTION

1. Field of the Invention

The present invention relates to a power voltage sensing circuit. More particularly, the present invention relates to a power edge detector.

2. Description of the Related Art

Usually, power edge detectors are utilized to sense operations termed "power up" and "power down" in the application of analog or digital circuitry. In the power up mode, the power edge detector receives an input power voltage, generating an enable output signal when the input power voltage has exceeded a predetermined threshold level. Before that, when the input power voltage is below the predetermined threshold level, the power edge detector generates a disable output signal to disable certain portions of the circuit to prevent uncertain function due to either voltage level or system noise. In the power down mode, the power edge detector generates the disable output signal when the input power voltage falls below the predetermined threshold level, thereby assuring that certain critical portions of the circuit are disabled when the power supply goes below the predetermined threshold level and preventing uncertain function due to voltage level or system noise.

However, conventional designs implement the power edge detector by means of complex circuit structures that are suitable only for specific applications.

SUMMARY OF THE INVENTION

It is therefore an object of the present invention to provide a general-purpose power edge detector implemented by a simple circuit structure.

The present invention achieves the above-indicated object by providing a power edge detector comprising a voltage divider, a pull-up circuit, and a cut-in pull-down circuit. The voltage divider receives and divides an input power voltage so as to generate a divided voltage. The pull-up circuit receives the input power voltage and transmits the input power voltage to an output terminal when the input power voltage does not exceed a predetermined threshold. The cut-in pull-down circuit is connected to the voltage divider and the pull-up circuit for pulling down the voltage level of the output terminal in response to the divided voltage when the input power voltage exceeds the predetermined threshold.

BRIEF DESCRIPTION OF DRAWINGS

The following detailed description, given by way of example and not intended to limit the invention to the embodiments described herein, will best be understood in conjunction with the accompanying drawings, in which.

DETAILED DESCRIPTION OF THE INVENTION

Figure 1:
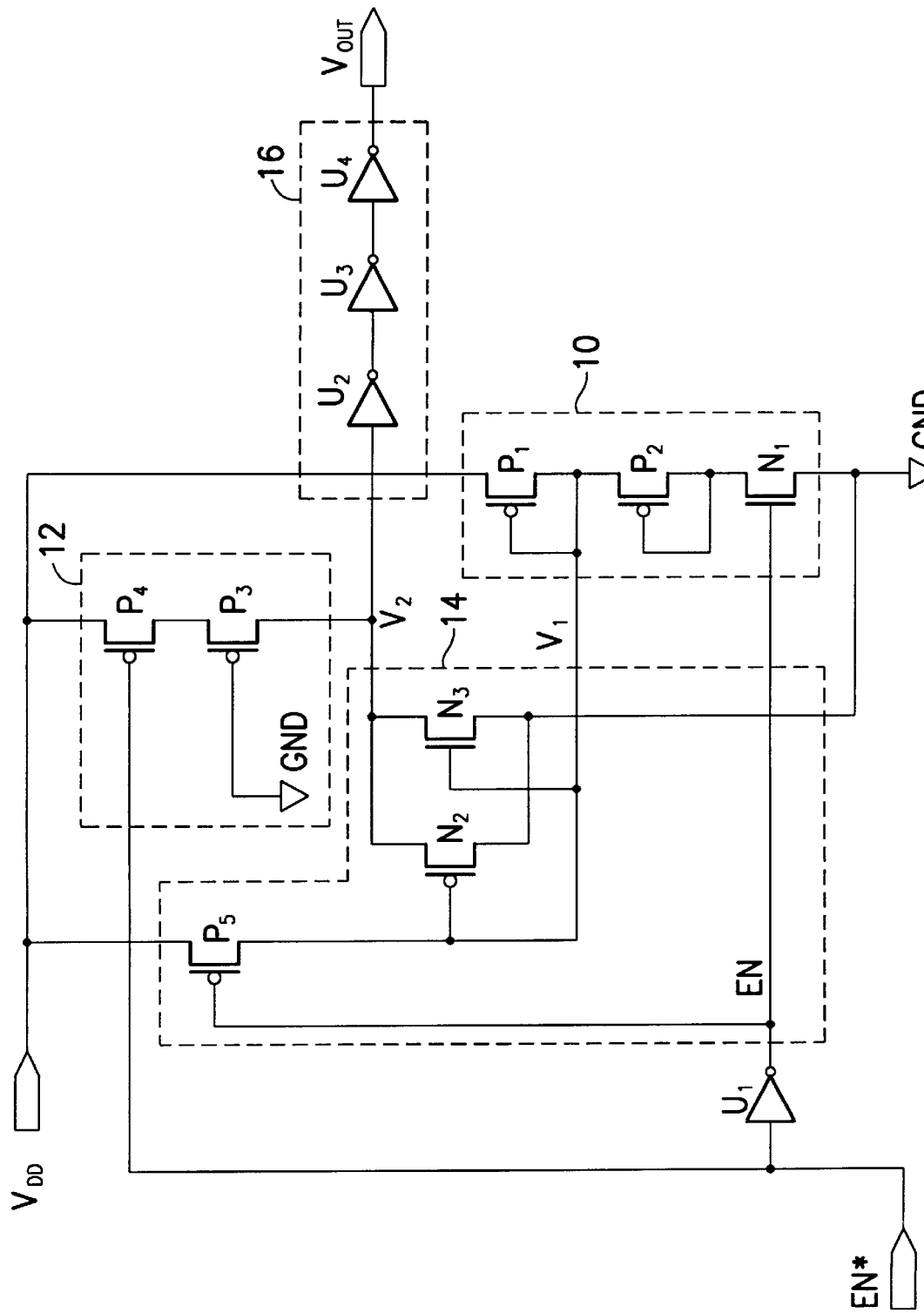
FIG. 1 depicts a circuit diagram of one preferred embodiment in accordance with a power edge detector of the present invention.

Referring to FIG. 1, a circuit diagram of one preferred embodiment of a power edge detector according to the present invention is schematically depicted. In FIG. 1, the power edge detector comprises a voltage divider 10, a pull-up circuit 12, a cut-in pull-down circuit 14, and a waveform shaper 16. The voltage divider 10, the pull-up circuit 12, and the cut-in pull-down circuit 14 are all controlled by a control signal EN*. For example, the operation of the voltage divider 10, the pull-up circuit 12, and the cut-in pull-down circuit 14 are disabled when the control signal EN* goes to a logic-high level, and enabled to sense an input power voltage when the control signal EN* goes to a logic-low level.

$V_{DD}$ represents an input power voltage simultaneously supplied to the voltage divider 10, the pull-up circuit 12, and the cut-in pull-down circuit 14. The voltage divider 10 receives the input power voltage $V_{DD}$, divides it and then provides a divided voltage $V_1$ to the cut-in pull-down circuit 14. Preferably, the divided voltage $V_1$ is linearly dependent upon the input power voltage $V_{DD}$. During the sensing operation the pull-up circuit 12 is kept turned on and connects with the cut-in pull-down circuit 14 at a circuit node $V_2$. Moreover, the cut-in pull-down circuit 14 is connected to a ground potential GND at other circuit node.

In the power up mode when the input power voltage $V_{DD}$ begins to increase but is below a predetermined threshold, and thus the divided voltage $V_1$ does not exceed a cut-in voltage level, the cut-in pull-down circuit 14 is off. Therefore, the circuit node $V_2$ is charged to the input power voltage $V_{DD}$ and continually increases by following the input power voltage $V_{DD}$. When the input power voltage $V_{DD}$ exceeds the predetermined threshold, and thus the divided voltage $V_1$ exceeds the cut-in voltage level, cut-in pull-down circuit 14 turns on, rapidly pulling the voltage level at the circuit node $V_2$ down to the ground potential GND.

In the power down mode when the input power voltage $V_{DD}$ begins to decrease but is still above the predetermined threshold, and thus the divided voltage $V_1$ still exceeds the cut-in voltage level, the cut-in pull-down circuit 14 is still turned on, thereby keeping the voltage level at the circuit node $V_2$ at the ground potential GND. When the input power voltage $V_{DD}$ is below the predetermined threshold, and thus the divided voltage $V_1$ is less than the cut-in voltage level, the cut-in pull-down circuit 14 is turned off through the divided voltage $V_1$, and thus the voltage level of the circuit node $V_2$ is rapidly pulled up to have the same potential as that of the input power voltage $V_{DD}$. Thereafter, the voltage level at the circuit node $V_2$ is continually decreased as the input power voltage $V_{DD}$ decreases.

When the circuit node $V_2$ is immediately pulled down to the ground potential GND during the power up operation, a falling edge occurs at the circuit node $V_2$ and is then processed by the waveform shaper 16 in order to generate an enable signal at an output terminal $V_{OUT}$. When the circuit node is immediately pulled up to the input power voltage $V_{DD}$ during the power down operation, a rising edge occurs at the circuit node $V_2$ and is then processed by the waveform shaper 16 to generate a disable signal at the output terminal $V_{OUT}$.

As shown in FIG. 1, the voltage divider 10 according to one preferred embodiment of the present invention comprises a pair of PMOS transistors $P_1$ and $P_2$, and an NMOS transistor $N_1$. The NMOS transistor $N_1$ is configured with its gate connected to a control signal EN, which is the complement of the control signal EN* generated by an inverter U1, and its source connected to the ground potential GND. The PMOS transistor $P_1$ is provided with its source receiving the input power voltage $V_{DD}$, and with its gate and drain connected together to generate the divided voltage $V_1$. The PMOS transistor $P_2$ is configured with its source connected to the gate and drain of the PMOS transistor $P_1$, and with its gate and drain connected together with the drain of the NMOS transistor $N_1$.

Moreover, the pull-up circuit 12 of FIG. 1 is constituted by two PMOS transistors $P_3$ and $P_4$ connected in series. The PMOS transistor $P_4$ is configured with its source receiving the input power voltage $V_{DD}$, its gate connected to the control signal EN*, and its drain connected to the source of the PMOS transistor $P_3$. The PMOS transistor $P_3$ is configured with its gate connected to the ground potential GND and its drain connected to the circuit node $V_2$.

In addition, the cut-in pull-down as shown in FIG. 1 is implemented by two NMOS transistors $N_2$ and $N_3$ and a PMOS transistor $P_5$. The PMOS transistor $P_5$ is configured with its gate connected to the control signal EN, its source connected to the input power voltage $V_{DD}$, and its drain for receiving the divided voltage $V_1$. The NMOS transistors $N_2$ and $N_3$ are connected in parallel, that is, their drains are connected to the circuit node $V_2$, their gates receive the divided voltage $V_1$, and their sources are connected to the ground potential GND.

Moreover, the waveform shaper 16 comprises three buffers $U_2$, $U_3$, and $U_4$ connected in series for converting the voltage level at the circuit node $V_2$ to the output terminal $V_{OUT}$.

Figure 2:
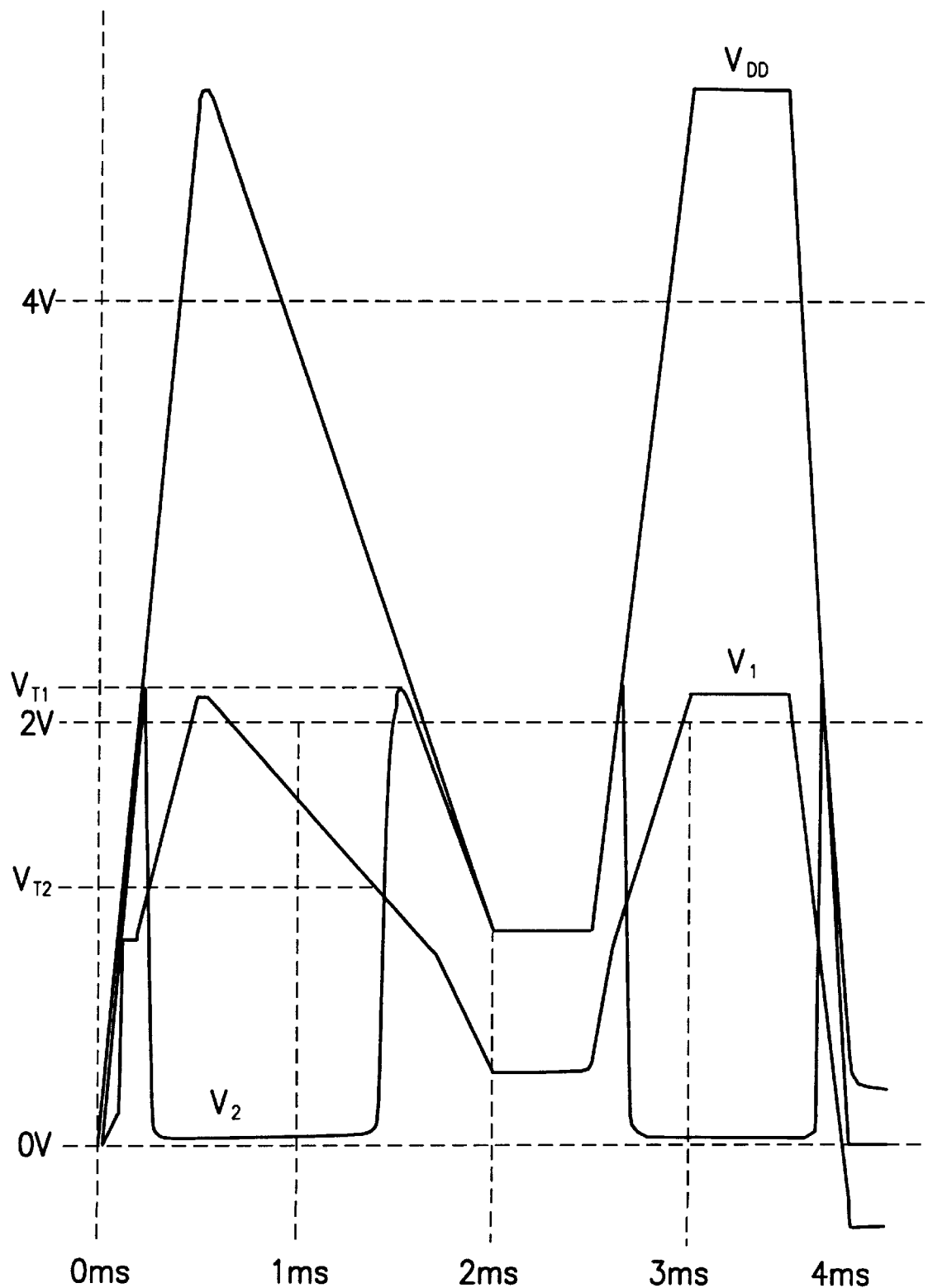
FIG. 2 illustrates a waveform diagram of the power edge detector as shown in FIG. 1 during the operations of power up and power down.

The operation of the power edge detector of FIG. 1 will now be explained with reference to a waveform diagram as shown in FIG. 2.

For sensing transition edges occurring to the input power voltage $V_{DD}$, the control signal EN* is set to the logic-low level so as to turn on the PMOS transistor $P_4$, turn off the PMOS transistor $P_5$ and turn on the NMOS transistor $N_1$, respectively.

In the power up mode, when the input power voltage $V_{DD}$ is less than the predetermined threshold $V_{T1}$ of about 2.2 V, and thus the divided voltage $V_1$ has not yet increased up to the cut-in voltage $V_{T2}$ of about 1.2 V, the NMOS transistors $N_2$ and $N_3$ are still turned off. Therefore, the input power voltage $V_{DD}$ appears at the circuit node $V_2$, which continually increases with the input power voltage $V_{DD}$ via the turned-on PMOS transistors $P_3$ and $P_4$. When the input power voltage $V_{DD}$ exceeds the predetermined threshold $V_{T1}$, and thus the divided voltage $V_1$ exceeds the cut-in voltage $V_{T2}$, the NMOS transistors $N_2$ and $N_3$ turn on to immediately pull the voltage level at the circuit node $V_2$ down to the ground potential GND.

In the power down mode, when the input power voltage $V_{DD}$ still exceeds the predetermined threshold $V_{T1}$, and thus the divided voltage $V_1$ is still greater than the cut-in voltage $V_{T2}$, both of the NMOS transistors $N_2$ and $N_3$ are still turned on to keep the voltage level of the circuit node $V_2$ at the ground potential GND. When the input power voltage $V_{DD}$ is below the predetermined threshold $V_{T1}$, and thus the divided voltage $V_1$ is less than the cut-in voltage $V_{T2}$, the NMOS transistors $N_2$ and $N_3$ are turned off, thereby immediately pulling the voltage level at the circuit node $V_2$ up to the current input power voltage $V_{DD}$ via the turned-on PMOS transistors $P_3$ and $P_4$. Thereafter, the voltage level of the circuit node $V_2$ decreases by following the input power voltage $V_{Dd}$.

Accordingly, when the circuit node $V_2$ is immediately pulled down to the ground potential GND during the power up operation, a falling edge occurs at the circuit node $V_2$ and is then processed by the waveform shaper 16 to generate an enable signal at an output terminal $V_{OUT}$. When the circuit node is immediately pulled up to the input power voltage $V_{DD}$ during the power down operation, a rising edge occurs at the circuit node $V_2$ and is then processed by the waveform shaper 16 to generate a disable signal at the output terminal $V_{OUT}$ so as to disable other circuit portions, thereby preventing uncertain function due to either voltage level or system noise.

In conclusion, the power edge detector in accordance with the present invention provides a general-purpose power edge detector that can be implemented by a quite simple circuit structure.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A power edge detector, comprising:
    a voltage divider receiving and dividing an input power voltage to generate a divided voltage;
    said voltage divider comprising:
        a first PMOS transistor having its source for receiving said input power voltage, and its gate and its drain for outputting said divided voltage;
        a second PMOS transistor having its source for outputting said divided voltage; and
        a first NMOS transistor having its gate for receiving a control signal, its drain connected to the drain of said second PMOS transistor, and its source connected to a ground potential;
    a pull-up circuit receiving said input power voltage and transmitting said input power voltage to an output terminal when said input power voltage is less than a predetermined threshold; and
    a cut-in pull-down circuit connected to said voltage and said divided pull-up circuit for pulling down a voltage level of said output terminal in response to said divided voltage when said input power voltage exceeds said predetermined threshold.

2. The power edge detector as claimed in claim 1, further comprising a waveform shaper connected at said output terminal.

3. The power edge detector as claimed in claim 2, wherein said waveform shaper comprises a plurality of buffers connected in series.

4. The power edge detector as claimed in claim 1, wherein said pull-up circuit comprises a third PMOS transistor having its source coupled to said input power voltage, its gate connected to said ground potential, and its drain connected to said output terminal.

5. The power edge detector as claimed in claim 4, wherein said pull-up circuit further comprises a fourth PMOS transistor having its source connected to said input power voltage, its gate connected to a control signal, and its drain connected to the source of said third PMOS transistor.

6. The power edge detector as claimed in claim 1, wherein said cut-in pull-down circuit comprises a second NMOS transistor having its drain connected to said output terminal, its gate connected to said divided voltage, and its source connected to said ground potential.

7. The power edge detector as claimed in claim 6, wherein said cut-in pull-down circuit comprises a fifth PMOS transistor having its source connected to said input power voltage, its gate connected to said control signal, and its drain connected to said divided voltage.

8. A power edge detector, comprising:

a voltage divider receiving and dividing an input power voltage to generate a divided voltage;

a pull-up circuit receiving said input power voltage and transmitting said input power voltage to an output terminal when said input power voltage is less than a predetermined threshold;

wherein said pull-up circuit comprises an input/ground/output PMOS transistor having its source coupled to said input power voltage, its gate connected to a ground potential, and its drain connected to said output terminal; and a cut-in pull-down circuit connected to said voltage divider and said pull-up circuit for pulling down a voltage level of said output terminal in response to said divided voltage when said input power voltage exceeds said predetermined threshold, said voltage divider comprising a receiving/outputting/outputting PMOS transistor having its source for receiving said input power voltage, and its gate and its drain for outputting said divided voltage and an outputting/ground/ground PMOS transistor having its source for outputting said divided voltage, and is gate and its drain coupled to said ground potential.

9. The power edge detector as claimed in claim 8, further comprising a waveform shaper connected at said output terminal.

10. The power edge detector as claimed in claim 9, wherein said waveform shaper comprises a plurality of buffers connected in series.

11. The power edge detector as claimed in claim 8, wherein said voltage divider further comprises a first NMOS transistor having its gate for receiving a control signal, its drain connected to the drain of said outputting/ground/ground PMOS transistor, and its source connected to said ground potential.

12. The power edge detector as claimed in claim 11, wherein said cut-in pull-down circuit comprises a second NMOS transistor having its drain connected to said output terminal, its gate connected to said divided voltage, and its source connected to said ground potential.

13. The power edge detector as claimed in claim 12, wherein said cut-in pull-down circuit comprises an input/control/divided PMOS transistor having its source connected to said input power voltage, its gate connected to said control signal, and its drain connected to said divided voltage.

14. A power edge detector, comprising:

a voltage divider receiving and dividing an input power voltage to generate a divided voltage;

a pull-up circuit receiving said input power voltage and transmitting said input power voltage to an output terminal when said input power voltage is less than a predetermined threshold; and a cut-in pull-down circuit connected to said voltage divider and said pull-up circuit for pulling down a voltage level of said output terminal in response to said divided voltage when said input power voltage exceeds said predetermined threshold;

wherein said cut-in pull-down circuit comprises a first NMOS transistor having its drain connected to said output terminal, its gate connected to said divided voltage, and its source connected to a ground potential; and an input/control/divided PMOS transistor having its source connected to said input power voltage, its gate connected to a control signal, and its drain connected to said divided voltage.

15. The power edge detector as claimed in claim 14, wherein said voltage divider comprises:

a receiving/outputting/outputting PMOS transistor having its source for receiving said input power voltage, and its gate and its drain for outputting said divided voltage; and an outputting/ground/ground PMOS transistor having its source for outputting said divided voltage, and its gate and its drain coupled to said ground potential.

16. The power edge detector as claimed in claim 15, wherein said voltage divider further comprises a second NMOS transistor having its gate for receiving a control, its drain connected to the drain of said outputting/ground/ground PMOS transistor, and its source connected to said ground potential.

17. The power edge detector as claimed in claim 16, wherein said pull-up circuit comprises an input/ground/outlet PMOS transistor having its source coupled to said input power voltage, its gate connected to said ground potential, and its drain connected to said output terminal.

* * * * *